(12) United States Patent
Watanabe

(10) Patent No.: US 9,483,091 B2
(45) Date of Patent: Nov. 1, 2016

(54) SYSTEM, INFORMATION PROCESSING DEVICE AND RACK

(71) Applicant: Murakumo Corporation, Tokyo (JP)

(72) Inventor: Takahiro Watanabe, Tokyo (JP)

(73) Assignee: MURAKUMO CORPORATION, Tokyo (JP)

( * ) Notice: Subject to any disclaimer, the term of this patent is extended or adjusted under 35 U.S.C. 154(b) by 0 days.

(21) Appl. No.: 14/661,446

(22) Filed: Mar. 18, 2015

(65) Prior Publication Data

US 2016/0048179 A1    Feb. 18, 2016

Related U.S. Application Data

(63) Continuation of application No. PCT/JP2014/071594, filed on Aug. 18, 2014.

(51) Int. Cl.
*G06F 1/20* (2006.01)
*H05K 7/20* (2006.01)

(52) U.S. Cl.
CPC ............. *G06F 1/20* (2013.01); *H05K 7/20727* (2013.01); *H05K 7/20781* (2013.01)

(58) Field of Classification Search
CPC .... H05K 7/20; H05K 7/209; H05K 4/20645; H05K 7/20809; H05K 7/20672; H05K 7/20263; H05K 7/20272; G06F 1/20; H01L 23/10; H01L 23/31; H01L 23/473; F28F 7/00; F28D 5/00; F28D 1/04
USPC ........... 361/679.46, 679.48, 679, 53, 679.54, 361/690–697, 698, 699, 700, 702–712, 715, 361/722–728; 165/80.2, 80.4, 80.5, 104.19, 165/104.21, 104.33, 121–126, 185; 174/16.3; 62/259.2; 312/223.2
See application file for complete search history.

(56) References Cited

U.S. PATENT DOCUMENTS

| | | | | |
|---|---|---|---|---|
| 6,643,132 B2* | 11/2003 | Faneuf | ............... | H05K 7/20809 165/104.33 |
| 6,693,797 B2* | 2/2004 | Faneuf | ............... | H05K 7/20809 165/104.33 |
| 6,776,221 B2* | 8/2004 | Montgomery | ........ | F28D 15/043 165/104.14 |
| 6,796,372 B2* | 9/2004 | Bear | ....................... | F28F 13/00 165/104.21 |
| 6,836,407 B2* | 12/2004 | Faneuf | ...................... | G06F 1/20 165/80.3 |
| 7,012,807 B2* | 3/2006 | Chu | .......................... | G06F 1/20 165/104.33 |

(Continued)

FOREIGN PATENT DOCUMENTS

| | | |
|---|---|---|
| JP | 08-082653 A | 3/1996 |
| JP | 2009-271643 A | 11/2009 |

(Continued)

OTHER PUBLICATIONS

International Search Report dated Nov. 25, 2014, issued in corresponding application No. PCT/JP2014/071594.

*Primary Examiner* — Michail V Datskovskiy
(74) *Attorney, Agent, or Firm* — Westerman, Hattori, Daniels & Adrian, LLP

(57) ABSTRACT

A rack in which a single or plurality of blade servers are installed includes: a fixing portion that detachably fixes the blade server; and a pipe with which cooling fluid supplied from outside the rack is passed through inside the rack and then introduced outside the rack, the pipe being thermally connected, in a state where the blade server is fixed by the fixing portion, to a heat transfer block thermally connected to at least one heat source included in the blade server.

24 Claims, 3 Drawing Sheets

(56) References Cited

U.S. PATENT DOCUMENTS

| | | | | |
|---|---|---|---|---|
| 7,403,384 B2* | 7/2008 | Pflueger | H05K 7/20545 | 165/104.21 |
| 7,508,669 B2* | 3/2009 | Fonfara | H01L 23/427 | 361/698 |
| 7,957,144 B2* | 6/2011 | Goettert | H05K 7/20809 | 165/80.2 |
| 8,164,901 B2* | 4/2012 | Neudorfer | G06F 1/20 | 165/104.21 |
| 8,305,754 B2* | 11/2012 | Wu | H05K 7/20781 | 165/104.21 |
| 8,817,473 B2* | 8/2014 | Babish | H01L 23/473 | 165/80.4 |
| 9,049,803 B2* | 6/2015 | Nordin | H05K 7/20809 | |
| 9,155,230 B2* | 10/2015 | Eriksen | H05K 7/20781 | |
| 2006/0187639 A1* | 8/2006 | Carswell | H05K 7/2079 | 361/699 |
| 2007/0291452 A1* | 12/2007 | Gilliland | H05K 7/20781 | 361/699 |
| 2007/0297136 A1* | 12/2007 | Konshak | H05K 7/20772 | 361/699 |
| 2008/0013283 A1* | 1/2008 | Gilbert | H05K 7/20772 | 361/715 |
| 2008/0225478 A1* | 9/2008 | Goettert | H05K 7/20809 | 361/679.53 |
| 2011/0303394 A1* | 12/2011 | Branton | H05K 7/20754 | 165/104.33 |
| 2014/0321050 A1* | 10/2014 | Sato | G06F 1/20 | 361/679.47 |
| 2016/0066472 A1* | 3/2016 | Cader | G06F 1/206 | 361/699 |

FOREIGN PATENT DOCUMENTS

| | | |
|---|---|---|
| JP | 2013-069087 A | 4/2013 |
| WO | 2013/069226 A1 | 5/2013 |

* cited by examiner

US 9,483,091 B2

SYSTEM, INFORMATION PROCESSING DEVICE AND RACK

CROSS-REFERENCE TO RELATED APPLICATION

This application is a continuation application of International Application PCT/JP2014/071594 filed on Aug. 18, 2014 and designated the U.S., the entire contents of which are incorporated herein by reference.

FIELD

The present disclosure relates to an information processing device installable in a rack.

BACKGROUND

Conventionally, an electrical component mounting structure has been proposed (see Japanese Patent Application Laid-open No. 2013-069087) with a configuration such that a terminal for making electrical connection is provided to one side portion of a daughterboard, a plurality of rows of sockets into which the terminal is inserted are provided to a motherboard, a circuit substrate of the daughterboard and a heat pipe are sandwiched by a pair of metal plates electrically insulated with respect to the circuit substrate, at least one end portion of the heat pipe extends up to an end portion of the metal plate, and heat of an arithmetic element of the daughterboard is carried to and released from one end portion side of the metal plate by the heat pipe.

Conventionally, various cooling techniques relating to information processing devices that generate heat upon use have been proposed. Particularly, there are cases where a water cooling scheme is employed as cooling means with high cooling performance for cooling of an information processing device with a relatively large amount of heat generation, such as a server.

However, since an electrical component becoming wet with liquid such as water needs to be avoided upon use of an information processing device, one needs to pay careful attention not to cause liquid leakage from a device for cooling. Particularly, in the case of employing the water cooling scheme in an information processing device (blade server or the like) to be attached to or detached from a rack, there is a possibility of a flow path of cooling fluid or cooling medium being damaged upon the information processing device being attached to or detached from the rack for maintenance, as well as a risk of an equipment failure, electric shock to a human body, and the like due to water leakage, since piping for a water path becomes complex. Therefore, it is necessary that the information processing device be attached or detached after the flow of cooling fluid or cooling medium has been stopped temporarily or the like.

SUMMARY

In view of a problem described above, a task of the present disclosure is to provide liquid cooling means of which maintenance is easy with respect to an information processing device to be attached to or detached from a rack.

In order to solve the task described above, the present disclosure employs following means. That is, an example of this disclosure is a system including: a single or plurality of information processing devices; and a rack in which the single or plurality of information processing devices can be installed, wherein the rack includes: a fixing portion with which the information processing device is detachably fixed; and a pipe with which cooling fluid supplied from outside the rack is passed through inside the rack and then introduced to the outside the rack, and wherein the information processing device includes : a fixable unit to be fixed by the fixing portion; and a heat transfer block thermally connected to at least one heat source included in the information processing device, the heat transfer block being thermally connected to the pipe in a state where the information processing device is fixed by the fixing portion.

It can be understand that aspects of the present disclosure include a rack, an information processing device, and a method of installing an information processing device to a rack.

The present disclosure can provide liquid cooling means of which maintenance is easy with respect to an information processing device to be attached to or detached from a rack.

DESCRIPTION OF EMBODIMENTS

A system, an information processing device, and a rack as an embodiment according to this disclosure will be described below based on the drawings. Note that the embodiment described below is an exemplification. The system, the information processing device, and the rack according to this disclosure are not limited to the specific configuration described below. In implementation, a specific configuration in accordance with an embodiment may be appropriately employed, or various improvements or modifications may be performed.

<System Configuration>

Figure 1:
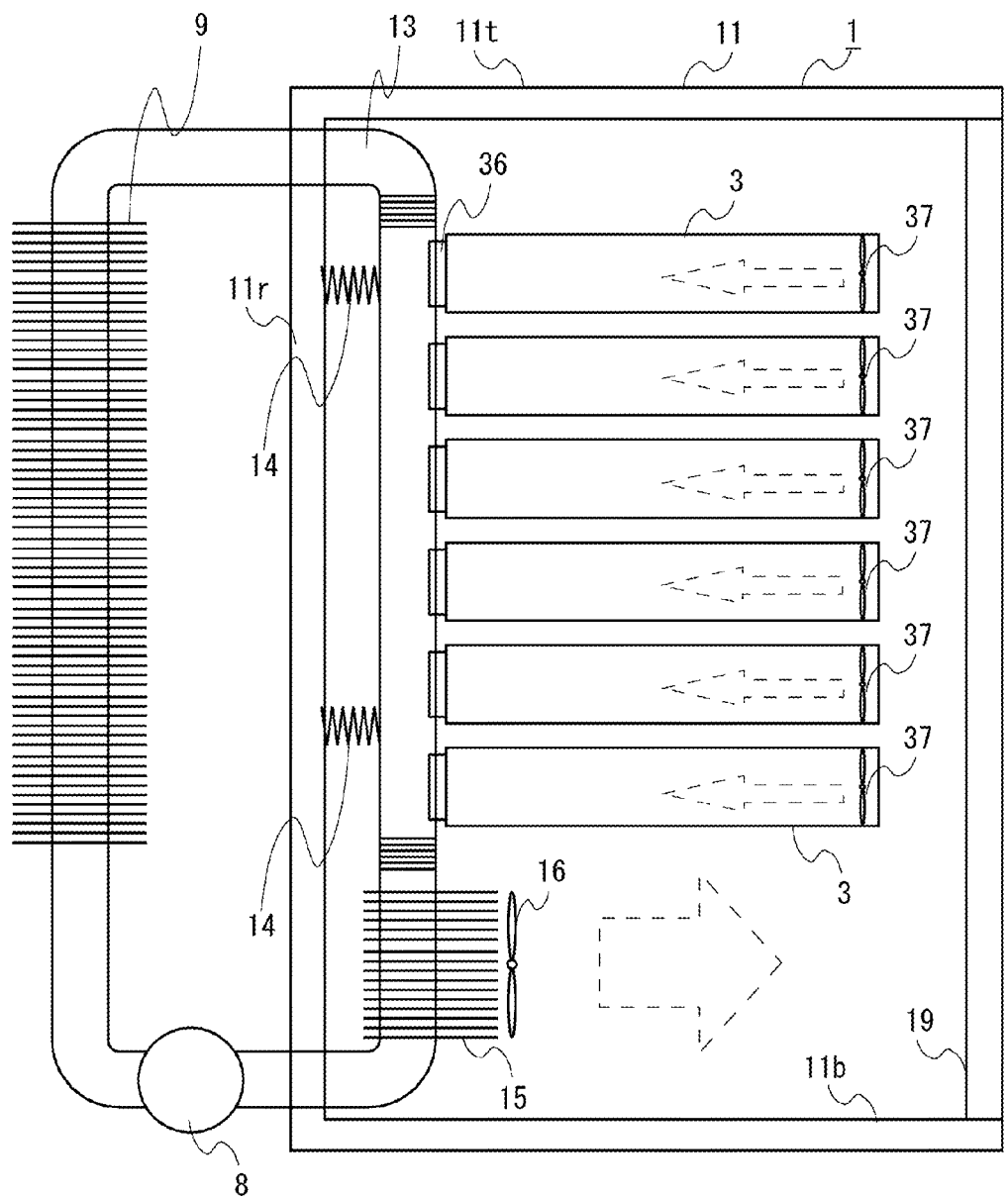
FIG. 1 is a side view showing the outline of a system according to an embodiment.
Figure 2:
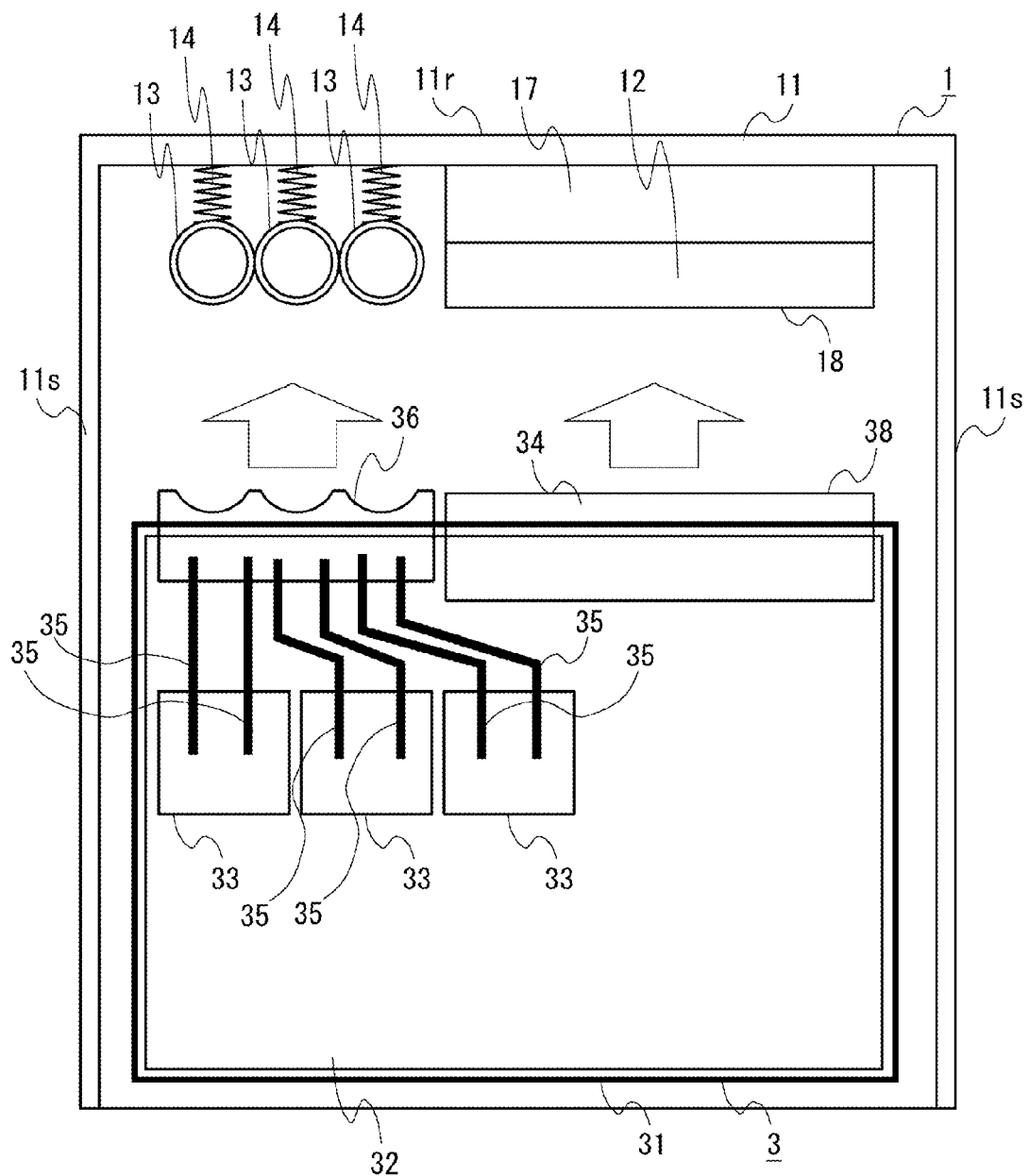
FIG. 2 is a plan view showing the outline of the system according to the embodiment.

FIG. 1 is a side view showing the outline of the system according to this embodiment. FIG. 2 is a plan view showing the outline of the system according to this embodiment. The system according to this embodiment includes a rack 1 to which a single or plurality of blade servers 3 are mountable and the single or plurality of blade servers 3 to be mounted to the rack 1. Arrows in broken lines in the drawings show the blowing direction, and arrows not in broken lines show the inserting direction of the blade server 3.

The rack 1 includes an enclosure 11, a fixing unit 12, a pipe 13, a biasing unit 14, a heat exchanger 15, a fan 16, power-supply or communication wiring 17, a rack-side connector 18, and a door 19. Outside the rack 1, a cooling device 9 for cooling of cooling fluid flowing within the pipe 13 is installed and connected with the pipe 13 included in the rack 1. In this embodiment, water is used as the cooling fluid, but other liquids may be used. It suffices that the cooling device 9 be a device capable of cooling the cooling fluid. For cooling of the cooling fluid, various cooling schemes may be employed, such as an air cooling scheme, a scheme in which groundwater, seawater, soil, or the like is used as a heat discharge destination with a large heat capacity, or a heat pump.

The blade server 3 is an information processing device including a chassis (blade server casing) 31, a base 32, a heat source 33 such as a central processing unit (CPU), a fixable unit 34, a heat pipe 35, a heat transfer block 36, an air intake unit (fan) 37, and an information processing device-side connector 38. A random access memory (RAM), a read only memory (ROM), a graphics processing unit (GPU), an auxiliary storage device, or the like may also be included as the heat source 33 in the blade server 3, but are omitted in the drawing. The blade server 3 has a structure in which the base 32 is accommodated within the chassis 31 having an approximately cubic external shape. The heat source 33, the heat transfer block 36, the information processing device-side connector 38, and the like are mounted to the base 32.

In this embodiment, the enclosure (rack casing) 11 includes a rear wall 11r, a top wall 11t, a bottom wall 11b, and left and right side walls 11s. Therefore, the rack 1 has an approximately cubic external shape. Note that the shape of the enclosure 11 is not limited to a cube. The enclosure 11 may be not high in airtightness, as long as air cooled by the heat exchanger 15 can be retained to some extent within the enclosure 11. At the rear wall 11r of the enclosure 11, a box accommodating the power-supply or communication wiring 17, the rack-side connector 18, and the pipe 13 are fixed. At an upper portion and a lower portion of the enclosure 11, holes for passing the pipe 13 through are provided.

At the front surface of the enclosure 11, the door 19 is provided and closed during normal operation of the blade server 3. The door 19 is opened upon performing maintenance of the blade server 3 to allow access to the inside of the rack 1 accommodating the blade server 3. By being closed, the door 19 increases the independence of air inside the enclosure 11 and prevents air cooled inside the enclosure 11 from leaking outside.

The pipe 13 is a flow path of cooling fluid for causing cooling fluid supplied from the cooling device 9 installed outside the rack 1 to be introduced into the rack 1, passed through the inside of the rack 1, and then introduced to the cooling device 9 outside the rack 1. A pump 8 is provided along the way of the flow path to circulate cooling fluid between the inside of the rack 1 and the cooling device 9. As described above, holes for passing the pipe 13 through are provided in the upper portion and lower portion of the enclosure 11. The pipe 13 and the pump 8 are installed such that cooling fluid cooled by the cooling device 9 is introduced from the pipe 13 on the hole side at the lower portion of the enclosure 11, and the cooling fluid used for cooling within the rack 1 is returned to the cooling device 9 from the pipe 13 on the hole side at the upper portion of the enclosure 11. That is, the pipe 13 and the pump 8 are arranged such that cooling fluid flows from the lower side to the upper side inside the rack 1.

A material with high heat conductivity is used as the material of the pipe 13. In this embodiment, the pipe 13 is a cylindrical metal tube. The pipe 13 may be covered with a material such as plastic. Note that at least a portion thermally connected with the heat transfer block 36 on the server side and a portion provided with the heat exchanger 15 are preferably not covered or covered with a material with high thermal conductivity in order to not prevent heat conduction.

In this embodiment, the pipe 13 has a bellows structure in each of a portion above a part contacting the heat transfer block 36 of the uppermost blade server 3 and a portion below a part contacting the heat transfer block 36 of the lowermost blade server 3. By being provided with such a bellows structure, the portion of the pipe 13 according to this embodiment that is thermally connected to the heat transfer block 36 is movable.

With the biasing unit 14, a portion of the pipe 13 including a part contacting the heat transfer block 36 of the blade server 3, i.e., a portion thermally connected to the heat transfer block 36 is biased in the heat transfer block 36 direction. In this embodiment, a spring is employed for the biasing unit 14, but other means may be employed. In a state where the blade server 3 is not fixed, the biasing unit 14 holds the pipe 13 in a position of the heat transfer block 36 in the case where the blade server 3 is fixed. Accordingly, in the case where the blade server 3 is fixed, the pipe 13 is pushed by the heat transfer block 36 such that the biasing unit 14 (spring) is compressed, and the biasing unit 14 biases the pipe 13 in the heat transfer block 36 direction. That is, in this embodiment, the degree of adhesion between the pipe 13 and the heat transfer block 36 is improved by making a part of the pipe 13 movable and further providing the biasing unit 14.

The heat exchanger 15 facilitates heat exchange between cooling fluid flowing within the pipe 13 and air within the rack 1 by being thermally connected to the pipe 13. In this embodiment, a radiator including a metal fin is employed as the heat exchanger 15. Note that, for the heat exchanger 15, other means such as a double-pipe heat exchanger may be employed, as long as heat exchange between cooling fluid flowing within the pipe 13 and air within the rack 1 is facilitated. The heat exchanger 15 is provided to the pipe 13 on the upstream side in the flow of cooling fluid (i.e., in the lower portion of the rack 1) relative to the portion thermally connected with the heat transfer block 36. This is to cause heat exchange to be performed between cooling fluid in a state where the temperature is relatively low (in a state where heat from the heat transfer block 36 is yet to be received) and air within the rack 1, so that the efficiency of heat exchange is increased. In this embodiment, the fan 16 sends air within the rack 1 to the heat exchanger 15 so that heat exchange between cooling fluid and air is facilitated. Note that the fan 16 may be omitted.

The air intake unit (fan) 37 takes in air with which heat has been exchanged with cooling fluid via the heat exchanger 15 into the blade server 3.

The heat transfer block 36 is thermally connected to at least one of the heat sources 33 included in the blade server 3 via the heat pipe 35. With the heat pipe 35, heat generated in the heat source 33 is collected at the heat transfer block 36. The heat transfer block 36 is thermally connected to the pipe 13 in a state where the blade server 3 is fixed by the fixing unit 12. A portion of the heat transfer block 36 contacting the pipe 13 may be shaped along the external shape of the pipe 13 in order to increase the degree of adhesion between the heat transfer block 36 and the pipe 13. Since the pipe 13 is cylindrical as described above in this embodiment, the portion of the heat transfer block 36 contacting the pipe 13 has a concave shape in an arc along the outer circumference of the cylindrical pipe 13.

Figure 3:
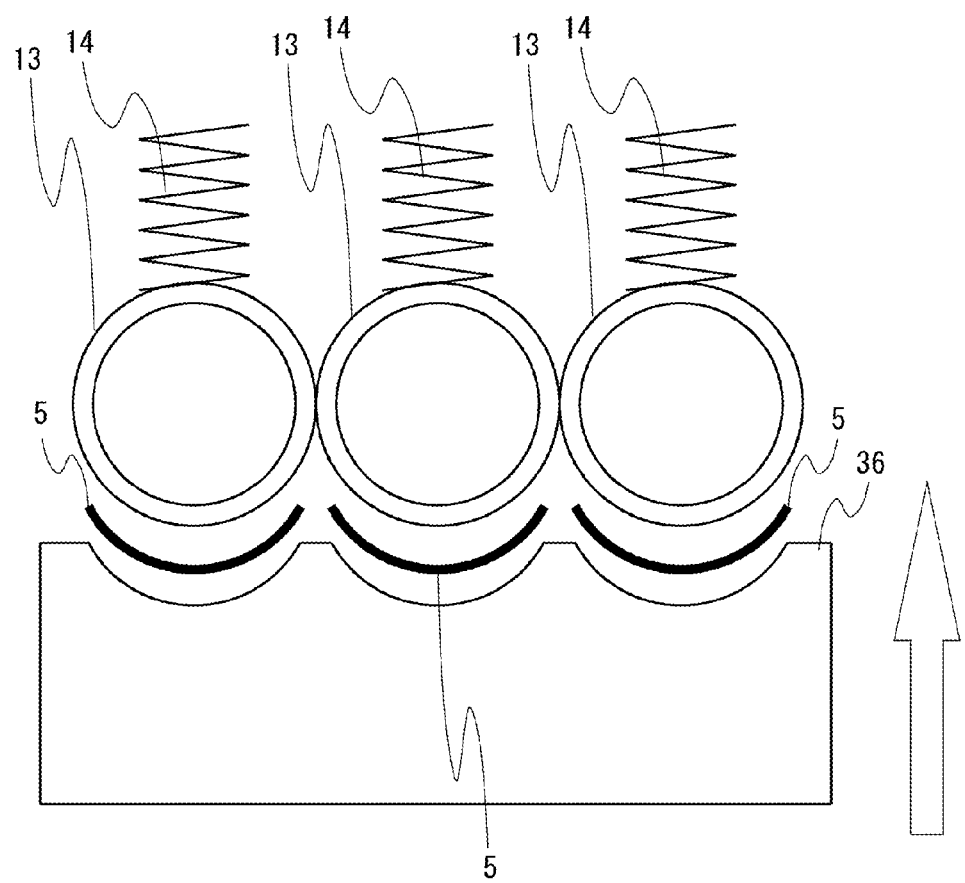
FIG. 3 is a view showing a heat transfer block being thermally connected to a pipe in the embodiment.

FIG. 3 is a view showing the heat transfer block 36 being thermally connected to the pipe 13 in the embodiment. The heat transfer block 36 and the pipe 13 are thermally connected via a heat transferring material (shim or spacer). In this embodiment, the heat transfer block 36 and the pipe 13 are thermally connected via a silicon rubber sheet 5 (material that is deformable and can fill a gap between the pipe 13 and the heat transfer block 36) having a thermal conductivity of 50 watts per meter Kelvin (W/m·K) or greater. Specifically, a silicon rubber sheet such as the "MANION 50α" (product name) can be used. In this embodiment, an example in which the heat transfer block 36 and the pipe 13 are thermally connected via the silicon rubber sheet 5 is described. However, a material to be sandwiched between the heat transfer block 36 and the pipe 13 is not limited to the silicon rubber sheet 5, as long as the material allows thermal connection (e.g., the material has a thermal conductivity of 1.0 watt per meter Kelvin (W/m·K) or greater). For example, the heat transfer block 36 and the pipe 13 may be thermally connected via grease.

The silicon rubber sheet 5 is an elastic material that adheres to the heat transfer block 36 and the pipe 13 by deforming in a state of being sandwiched and pressed between the heat transfer block 36 and the pipe 13. Therefore, highly efficient heat release can be performed without the thermal connection being blocked by air or the like. The heat transferring material that adheres to the heat transfer block 36 and the pipe 13 is not limited to the silicon rubber sheet 5. For example, the grease described above can also adhere to the heat transfer block 36 and the pipe 13 to prevent blockage of heat conduction by air or the like.

The material (silicon rubber sheet 5 in this embodiment) provided between the heat transfer block 36 and the pipe 13 may be fixed by sticking or the like on the rack 1 side (i.e., on the surface of the pipe 13) or may be fixed by sticking or the like on the blade server 3 side (i.e., on the surface of the heat transfer block 36). The heat transferring material (silicon rubber sheet 5 in this embodiment) may be installed upon fixing of the blade server 3 to the rack 1, without being fixed to the rack 1 or the blade server 3.

The fixing unit 12 of the rack 1 and the fixable unit 34 of the blade server 3 coordinate to detachably fix the blade server 3 with respect to the rack 1. In this embodiment, a structure in which one is fitted to the other or a structure in which one is sandwiched by the other is employed for the fixing unit 12 and the fixable unit 34. Note that other means maybe employed as means for fixing the blade server 3 to the rack 1. In this embodiment, the fixing unit 12 also serves as a housing that accommodates the rack-side connector 18, and the fixable unit 34 also serves as a housing that accommodates the information processing device-side connector 38.

Therefore, the rack-side connector 18 and the information processing device-side connector 38 electrically connects the wiring 17 to the blade server 3 in a state where the fixable unit 34 of the blade server 3 is fixed by the fixing unit 12 of the rack 1. That is, in this embodiment, installation of the blade server 3 by the fixing unit 12 and the fixable unit 34, thermal connection between the heat transfer block 36 and the pipe 13, and connection of the information processing device-side connector 38 and the rack-side connector 18 are performed in coordination.

<Work Procedure>

Next, the work procedure of attachment or detachment of the blade server 3 with respect to the rack 1 in this embodiment will be described. The side wall 11s of the enclosure 11 of the rack 1 is provided with a rail (omitted in the drawing) as a guide upon inserting the blade server 3 horizontally into the enclosure 11. Upon installation of the blade server 3, a worker aligns the side surface of the blade server 3 with the rail and then inserts the blade server 3 into the rack 1 along the rail.

The fixing unit 12 of the rack 1 is provided to the rear wall 11r of the enclosure 11. The fixable unit 34 of the blade server 3 is provided in a position (see FIG. 2) at the far side of the blade server 3 (proceeding direction side in the case of inserting the blade server 3 into the rack 1) for fitting to the fixing unit 12 of the rack 1 in the case where the blade server 3 is inserted. As described above, in this embodiment, the fixing unit 12 also serves as a housing that accommodates the rack-side connector 18, and the fixable unit 34 also serves as a housing that accommodates the information processing device-side connector 38.

The pipe 13 is held by the biasing unit 14 to a position on the rear wall 11r side of the enclosure 11 to not interfere with the fixing unit 12. The heat transfer block 36 is provided in a position (see FIG. 2) at the far side of the blade server 3 (proceeding direction side in the case of inserting the blade server 3 into the rack 1) such that the pipe 13 can be pushed in the direction of the rear wall 11r of the rack 1 in the case where the blade server 3 is inserted.

Therefore, when a worker inserts the blade server 3 into the rack 1 along the rail, the fixable unit 34 of the blade server 3 is fitted to the fixing unit 12 of the rack 1 simultaneously with the information processing device-side connector 38 and the rack-side connector 18 being electrically connected and with the pipe 13 and the heat transfer block 36 being thermally connected.

Upon removing the blade server 3 from the rack 1, it suffices for a worker to pull out the blade server 3 from within the rack 1 along the rail. Accordingly, the fitted state of the fixable unit 34 of the blade server 3 and the fixing unit 12 of the rack 1, the electrical connection of the information processing device-side connector 38 and the rack-side connector 18, and the thermal connection of the pipe 13 and the heat transfer block 36 are simultaneously released.

With this embodiment, maintenance can be performed with easy work without stopping the flow of cooling fluid upon maintenance of the information processing device, even in the case where a liquid cooling scheme is employed for cooling of the information processing device, by performing the work with the procedure described above.

<Flow of Air within Rack>

Out of heat generated in the heat source 33, heat that has been unable to be collected by the heat pipe 35 is released into air within the enclosure 11. Therefore, in this embodiment, air within the enclosure 11 is cooled by causing heat exchange between cooling fluid within the pipe 13 and air within the enclosure 11 using the heat exchanger 15 provided to the pipe 13. Cooled air is passed through inside the chassis 31 of the blade server 3 by the air intake unit (fan) 37 provided to each blade server 3 and circulates within the enclosure 11.

More specifically, air within the rack 1 is passed through the heat exchanger 15 by the rotation of the fan 16 provided to the rack 1, and heat exchange is performed between cooling fluid and air via the heat exchanger 15. In this embodiment, cooled air is sent to the front surface side of the rack 1 by the fan 16. Air sent to the front surface side of the rack 1 is taken in from the front surface of the blade server by the air intake unit (fan) 37 included in each blade server 3 and cools the heat source 33 within the chassis 31. Air that has been used for cooling of the heat source 33 and risen in temperature is discharged to the rear wall 11r side of the rack 1 directly from the rear of the blade server 3 and cooled again by the heat exchanger 15.

In this embodiment, heat that has been unable to be collected by the heat pipe 35 out of heat generated in the heat source 33 can also be processed efficiently by the flow of air as described above being created within the rack 1. While an example in which the heat exchanger 15 is installed in the lower portion of the rack 1 has been described in this embodiment, air with a higher temperature is more likely to accumulate in the upper portion of the rack. Therefore, the heat exchanger may be installed in the upper portion of the rack. In the case of installing the heat exchanger in the upper portion of the rack, the flowing direction of cooling fluid within the pipe may be an opposite direction (i.e., such that cooling fluid flows to the lower side from the upper side of the rack) of the direction described in this embodiment.

What is claimed is:

1. A system comprising:
    a single or plurality of information processing devices; and
    a rack in which the single or plurality of information processing devices can be installed, wherein
    the rack comprises:
    a fixing portion with which the information processing device is detachably fixed; and
    a flow path with which cooling fluid supplied from outside the rack is passed through inside the rack and then introduced to the outside of the rack, and wherein
    the information processing device comprises:
    a fixable portion to be fixed by the fixing portion; and
    a heat transfer block thermally connected to at least one heat source included in the information processing device, the heat transfer block being thermally connected to the flow path in a state where the information processing device is fixed by the fixing portion,
    wherein the flow path has at least a movable portion thermally connected to the heat transfer block, and
    the rack further comprises a biasing unit that biases at least a portion of the flow path thermally connected to the heat transfer block in a direction of the heat transfer block.

2. The system according to claim 1, wherein a portion of the heat transfer block contacting the flow path is shaped along an external shape of the flow path.

3. The system according to claim 1, wherein
    the flow path is in a cylindrical shape, and
    a portion of the heat transfer block contacting the flow path is shaped along an external shape of the cylindrical flow path.

4. The system according to claim 1, wherein the heat transfer block and the flow path are thermally connected via a heat transferring material.

5. The system according to claim 4, wherein the heat transfer block and the flow path are thermally connected via a material having a thermal conductivity of 1.0 watt per meter Kelvin (W/m·K) or greater.

6. The system according to claim 4, wherein the heat transfer block and the flow path are thermally connected via a material having a thermal conductivity of 50 watts per meter Kelvin (W/m·K) or greater.

7. The system according to claim 4, wherein the heat transfer block and the flow path are thermally connected via a material that adheres to the heat transfer block and the flow path by deformation.

8. The system according to claim 7, wherein the heat transfer block and the flow path are thermally connected via grease.

9. The system according to claim 7, wherein the heat transfer block and the flow path are thermally connected via a silicon rubber sheet.

10. The system according to claim 1, wherein the flow path is partly provided with a bellows structure to be movable at least in a portion thereof thermally connected to the heat transfer block.

11. The system according to claim 1, wherein the rack further comprises a heat exchanger that facilitates heat exchange between cooling fluid flowing within the flow path and air within the rack by being thermally connected to the flow path.

12. The system according to claim 11, wherein the heat exchanger is provided on a position further toward an upstream side in a flow of the cooling fluid than a portion of the flow path thermally connected to the heat transfer block.

13. The system according to claim 11, wherein the information processing device further comprises an air intake unit that takes in air, with which heat has been exchanged with the cooling fluid via the heat exchanger, into the information processing device.

14. The system according to claim 1, wherein the rack further comprises:
    wiring for power supply or for communication; and
    a rack-side connector for electrically connecting the wiring to the information processing device in a state where the information processing device is fixed by the fixing portion, and
    the information processing device further comprises an information processing device-side connector for electrically connecting the information processing device to the wiring in a state where the fixable portion is fixed to the rack, so that thermal connection between the flow path and the heat transfer block and electrical connection between the rack-side connector and the information processing device-side connector coordinate.

15. The system according to claim 1, wherein the information processing device further comprises a heat pipe that thermally connects the heat source and the heat transfer block.

16. The system according to claim 1, wherein the rack further comprises a door that, by being opened, allows access to an inside of the rack accommodating the fixed information processing device.

17. A rack in which a single or plurality of information processing devices can be installed, comprising:
    a fixing portion that detachably fixes the information processing device; and
    a flow path with which cooling fluid supplied from outside the rack is passed through inside the rack and then introduced outside the rack, the flow path being thermally connected, in a state where the information processing device is fixed by the fixing portion, to a heat transfer block thermally connected to at least one heat source included in the information processing device,
    wherein the flow path has at least a movable portion thermally connected to the heat transfer block, and
    the rack further comprises a biasing unit that biases at least a portion of the flow path thermally connected to the heat transfer block in a direction of the heat transfer block.

18. The rack according to claim 17, wherein the heat transfer block and the flow path are thermally connected via a heat transferring material.

19. The rack according to claim 18, wherein the heat transfer block and the flow path are thermally connected via a material that adheres to the heat transfer block and the flow path by deformation.

20. The rack according to claim 17, further comprising:
    wiring for power supply or for communication; and
    a rack-side connector for electrically connecting the wiring to the information processing device in a state where the information processing device is fixed by the fixing portion, so that thermal connection between the flow path and the heat transfer block and electrical connection between the rack-side connector and an information processing device-side connector coordinate.

21. The rack according to claim 17, wherein the flow path is partly provided with a bellows structure to be movable at least in a portion thereof thermally connected to the heat transfer block.

22. A system comprising:
a single or plurality of information processing devices; and
a rack in which the single or plurality of information processing devices can be installed, wherein
the rack comprises:
a fixing portion with which the information processing device is detachably fixed; and
a flow path with which cooling fluid supplied from outside the rack is passed through inside the rack and then introduced to the outside of the rack, and wherein
the information processing device comprises:
a fixable portion to be fixed by the fixing portion; and
a heat transfer block thermally connected to at least one heat source included in the information processing device, the heat transfer block being thermally connected to the flow path in a state where the information processing device is fixed by the fixing portion,
wherein the rack further comprises a heat exchanger that facilitates heat exchange between cooling fluid flowing within the flow path and air within the rack by being thermally connected to the flow path, and
wherein the heat exchanger is provided on a position further toward an upstream side in a flow of the cooling fluid than a portion of the flow path thermally connected to the heat transfer block.

23. A system comprising:
a single or plurality of information processing devices; and
a rack in which the single or plurality of information processing devices can be installed, wherein
the rack comprises:
a fixing portion with which the information processing device is detachably fixed; and
a flow path with which cooling fluid supplied from outside the rack is passed through inside the rack and then introduced to the outside of the rack, and wherein
the information processing device comprises:
a fixable portion to be fixed by the fixing portion; and
a heat transfer block thermally connected to at least one heat source included in the information processing device, the heat transfer block being thermally connected to the flow path in a state where the information processing device is fixed by the fixing portion,
wherein the rack further comprises a heat exchanger that facilitates heat exchange between cooling fluid flowing within the flow path and air within the rack by being thermally connected to the flow path, and
wherein the information processing device further comprises an air intake unit that takes in air, with which heat has been exchanged with the cooling fluid via the heat exchanger, into the information processing device.

24. A rack in which a single or plurality of information processing devices can be installed, comprising:
a fixing portion that detachably fixes the information processing device; and
a flow path with which cooling fluid supplied from outside the rack is passed through inside the rack and then introduced outside the rack, the flow path being thermally connected, in a state where the information processing device is fixed by the fixing portion, to a heat transfer block thermally connected to at least one heat source included in the information processing device,
wherein the rack further comprises a heat exchanger that facilitates heat exchange between cooling fluid flowing within the flow path and air within the rack by being thermally connected to the flow path, and
wherein the heat exchanger is provided on a position further toward an upstream side in a flow of the cooling fluid than a portion of the flow path thermally connected to the heat transfer block.

* * * * *